(12) United States Patent
Jang

(10) Patent No.: US 8,344,792 B2
(45) Date of Patent: Jan. 1, 2013

(54) METHODS AND CIRCUITS FOR GENERATING REFERENCE VOLTAGE

(75) Inventor: Seong Jin Jang, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 1540 days.

(21) Appl. No.: 11/191,376

(22) Filed: Jul. 28, 2005

(65) Prior Publication Data

US 2006/0038577 A1    Feb. 23, 2006

(30) Foreign Application Priority Data

Aug. 20, 2004 (KR) .......................... 10-2004-0065669

(51) Int. Cl.
*G05F 1/10* (2006.01)
(52) U.S. Cl. ........................................ 327/538; 327/530
(58) Field of Classification Search .................. 327/530, 327/538, 544
See application file for complete search history.

(56) References Cited

U.S. PATENT DOCUMENTS

| | | | | |
|---|---|---|---|---|
| 5,041,738 A | * | 8/1991 | Walters, Jr. ................... | 327/130 |
| 5,818,783 A | | 10/1998 | Kim .............................. | 365/226 |
| 5,856,756 A | * | 1/1999 | Sasahara et al. .............. | 327/540 |
| 6,133,779 A | * | 10/2000 | Sichert et al. ................. | 327/540 |
| 6,246,243 B1 | * | 6/2001 | Audy ............................ | 324/550 |
| 6,351,137 B1 | * | 2/2002 | Hariton ......................... | 326/30 |
| 6,442,053 B1 | * | 8/2002 | Gowda et al. ................ | 363/127 |
| 6,560,290 B2 | * | 5/2003 | Ahn et al. ..................... | 375/259 |
| 6,677,801 B2 | * | 1/2004 | Shimomura .................. | 327/530 |
| 7,126,513 B1 | * | 10/2006 | Zinn et al. .................... | 341/139 |
| 2004/0119524 A1 | * | 6/2004 | Tauber et al. ................. | 327/530 |
| 2005/0099219 A1 | * | 5/2005 | Dabral et al. ................. | 327/309 |
| 2006/0238186 A1 | * | 10/2006 | Nishikawa et al. .......... | 324/71.1 |

FOREIGN PATENT DOCUMENTS

| | | |
|---|---|---|
| JP | 07-064956 | 3/1995 |
| KR | 1998-0075712 | 11/1998 |
| KR | 1999-4354 | 1/1999 |

\* cited by examiner

*Primary Examiner* — Long Nguyen
(74) *Attorney, Agent, or Firm* — F. Chau & Associates, LLC

(57) ABSTRACT

A circuit for generating a reference voltage includes a first reference voltage generating circuit disposed outside a chip and a second reference voltage generating circuit disposed inside the chip. The first and second reference voltage generating circuits output first and second reference voltages to first and second output terminals, respectively. The second reference voltage generating circuit includes at least one pull-up resistor and at least one pull-down resistor. The pull-up resistor is coupled between a first node where an internal power supply voltage is coupled and the second output terminal. The pull-down resistor is coupled between a second node and the second output terminal, wherein a voltage at the second node is relatively lower than a voltage at the first node. A third reference voltage is outputted from a node where the first output terminal is coupled to the second output terminal.

12 Claims, 7 Drawing Sheets

METHODS AND CIRCUITS FOR GENERATING REFERENCE VOLTAGE

CROSS-REFERENCE TO RELATED APPLICATION

This application claims priority to Korean Patent Application No. 2004-65669, filed on Aug. 20, 2004, the content of which is hereby incorporated by reference in its entirety.

BACKGROUND OF THE INVENTION

1. Field of the Invention

The present invention relates to circuits and methods for generating a reference voltage. More particularly, the present invention relates to circuits and methods for generating a reference voltage by using both an external reference voltage generating circuit and an internal reference voltage generating circuit.

2. Description of the Related Art

In general, "logic level" refers to signals that are at a low voltage when in the logic "low" or "false" state, and at a specified higher voltage when in the logic "high" or "true" state. Generally, a predetermined reference voltage is used to determine whether a received digital data signal is in a logic "high" state or logic "low" state in order to perform data transmission between chips in computers. The reference voltage may have an average value between a voltage level corresponding to a logic "high" state and a voltage level corresponding to a logic "low" state so that the reference voltage can be compared to an input digital data signal.

Generally, the voltage level of the input data signal is compared to the reference voltage by an input buffer of a receiver, which may include a differential amplifier as a comparator and the comparison result is transmitted to an internal logic of the receiver.

FIG. 1 is a block diagram illustrating a reference voltage for use in the data transmission. Referring to FIG. 1, a reference voltage Vref is applied to an input buffer 110 of a chip 100 and compared to a voltage level of a data input signal Vin received through a data receiving pad 130. When the voltage level of the data input signal Vin is higher than the voltage level of the reference voltage Vref, an output signal Vout having a logic "high" level is outputted to the internal logic of the chip 100. When the voltage level of the data input signal Vin is lower than the voltage level of the reference voltage Vref, the output signal Vout having a logic "low" level is outputted to the internal logic of the chip 100.

Therefore, the stability of the reference voltage Vref greatly affects data transmission accuracy. If the reference voltage Vref varies, the setup time and hold time of an input signal, which become shorter as the data rate increases, may be different from the values designated in the design process of a chip.

Thus, the reference voltage Vref, which needs to be kept stable, may fluctuate for various reasons. First, signal interference caused by parasitic capacitance of a MOS transistor of the input buffer that receives the reference voltage may affect a voltage level of the reference voltage. Particularly, a magnitude of the signal interference may increase as the data transmission rate increases. In addition, the reference voltage may be affected by noise on the power supply voltage, variations in a process of each chip, and variations in internal temperature, etc.

Various interface standards specify interfaces in data transmission between a memory chip and a memory controller. There are standards which specify either a method of receiving an external reference voltage through a pad or a method of generating an internal reference voltage.

FIGS. 2A and 2B are schematic views illustrating a conventional method of generating a reference voltage. Referring to FIG. 2A, a reference voltage VREFint is generated based on an internal power supply voltage 201 of a chip. Particularly, the reference voltage VREFint is generated by dividing the internal power supply voltage 201 using a pull-up resistor 203 and a pull-down resistor 204.

Referring to FIG. 2B, a reference voltage VREFext is generated outside the chip, based on an external power supply voltage 211 of the chip. Similarly to FIG. 2A, the reference voltage VREFext is generated by dividing the external power supply voltage 211 using a pull-up resistor 213 and a pull-down resistor 214. The reference voltage VREFext may be provided to the chip through a pad 215.

Each method of generating the reference voltage VREFint or VREFext as described above with reference to FIGS. 2A and 2B has its advantages and disadvantages.

First, in the method of generating the reference voltage VREFext outside the chip, the reference voltage VREFext having a fixed voltage level is provided to the chip without any compensation for variations in process, temperature, etc. However, using the reference voltage VREFext may be advantageous, in that the reference voltage VREFext is not interfered with by the noise on the internal power supply voltage of the chip.

In the method of generating the reference voltage VREFint, the reference voltage VREFint may be interfered with by the noise on the internal power supply voltage of the chip, in contrast to with the reference voltage VREFext which is not interfered with by the noise on the internal power supply voltage of the chip. When various circuit components are integrated in one chip to implement a system, especially for a semiconductor device, a number of transistors may be integrated on the chip to increase an integration level of the semiconductor device. In such cases, as the numerous transistors in the semiconductor device are repeatedly turned on and off, the amount of variation in current through the transistors is increased, causing the power supply voltage to be unstable. The instability of the power supply voltage may have an influence on the reference voltage. However, the method of generating the reference voltage VREFint may be advantageous in that the reference voltage VREFint may compensate for the variations in process, temperature, etc.

Thus, because of the aforementioned trade-off relationship between the two methods, attaining the stability of the reference voltage by using only one of the two methods is difficult.

A conventional automatic mode selection circuit, which is disclosed in U.S. Pat. No. 5,818,783, includes external reference voltage delivery means for delivering an external high-speed input/output reference voltage in a high-speed input/output interface mode and internal reference voltage generation means for generating an internal transistor-transistor logic reference voltage in a low-voltage transistor-transistor logic (LVTTL) mode. The automatic mode selection circuit according to U.S. Pat. No. 5,818,783 automatically selects one of the low-voltage transistor-transistor logic (LVTTL) mode and the high-speed input/output interface mode in a semiconductor memory device. The automatic mode selection circuit according to U.S. Pat. No. 5,818,783 is directed to reducing an occupied area on a chip and operation speed improvement, but not directed to improving the stability of the reference voltage.

In addition, a conventional circuit for generating a reference voltage is disclosed in Korean Patent No. 0267088, which includes means for generating an internal reference voltage, a pad to which an external reference voltage is applied, means for selecting one of the internal reference voltage and an external reference voltage and switching means for outputting a selected reference voltage. Korean Patent No. 0267088 does not discuss methods to improve the stability of the reference voltage.

SUMMARY OF THE INVENTION

The exemplary embodiments of the present invention generally provide circuits and methods for generating a reference voltage by generating an internal reference voltage or by receiving the reference voltage from an external reference voltage generating source so as to improve a stability of the reference voltage.

In various exemplary embodiments of the present invention, a circuit for generating a reference voltage for use in a semiconductor device comprises a first reference voltage generating circuit and a second reference voltage generating circuit. The first reference voltage generating circuit is disposed outside a chip, configured to output a first reference voltage to a first output terminal. The second reference voltage generating circuit is disposed inside the chip, configured to output a second reference voltage to a second output terminal. The second reference voltage generating circuit includes at least one pull-up resistor and at least one pull-down resistor. The at least one pull-up resistor is coupled between a first node and the second output terminal, wherein the first node is electrically coupled to an internal power supply voltage of the chip. The at least one pull-down resistor is coupled between a second node and the second output terminal, wherein a voltage at the second node is relatively lower than a voltage at the first node. A third reference voltage is outputted from a node where the first output terminal is coupled to the second output terminal.

In one exemplary embodiment, the second reference voltage generating circuit may be permanently deactivated by using one of a fuse, bonding, pin option and ball bias option.

In one exemplary embodiment, the second reference voltage generating circuit may be deactivated by combining a mode control register.

In one exemplary embodiment, a resistance of the pull-up resistor and a resistance of the pull-down resistor are varied according to a control signal, which is generated in response to a mode register set command.

In another exemplary embodiment of the present invention, there is provided a circuit for generating a reference voltage for use in a semiconductor device, which includes a first reference voltage generating circuit and a second reference voltage generating circuit. The first reference voltage generating circuit is disposed outside a first chip, configured to output a first reference voltage to a first output terminal. The second reference voltage generating circuit outputs a second reference voltage to a second output terminal of the chip. The second reference voltage generating circuit includes at least one pull-up resistor, at least one first pull-down resistor, a second pull-down resistor and a conductive line. The at least one pull-up resistor is disposed inside the first chip and coupled between a first node and the second output terminal, wherein the first node is electrically coupled to an internal power supply voltage of a first chip. The at least one first pull-down resistor is disposed inside the first chip and coupled to the second output terminal. The second pull-down resistor is disposed inside a second chip and coupled to a ground. The conductive line having a first impedance is electrically coupled between the at least one first pull-down resistor and the second pull-down resistor, wherein a third reference voltage is outputted at a node where the first output terminal is electrically shorted to the second output terminal.

In one exemplary embodiment, the pull-up resistor and the first pull-down resistor have substantially the same resistance and the second pull-down resistor has a resistance substantially equal to the sum of the first impedance and a turn-on resistance of an open drain driver that is used for data transmission between the first chip and second chip.

In one exemplary embodiment, the second reference voltage generating circuit is adapted to be permanently deactivated by using one of a fuse, bonding, pin option and ball bias option.

In another exemplary embodiment of the present invention, there is provided a semiconductor device, which includes a first input pad, a second input pad, at least one pull-up resistor and at least one pull-down resistor. The first input pad receives a first reference voltage that is externally provided. The second input pad receives a control voltage that is externally provided. The at least one pull-up resistor is coupled between a power supply voltage and a second output terminal, wherein a second reference voltage is outputted to the second output terminal. The at least one pull-down resistor is coupled between the second output terminal and the second input pad, wherein the pull-up resistor and the first pull-down resistor have substantially the same resistance. The first reference voltage has a voltage level corresponding to a summed voltage of the control voltage and a voltage across the at least one pull-down resistor. A third reference voltage is outputted at a node where the first input pad is electrically shorted to the second output terminal.

In yet another exemplary embodiment of the present invention, there is provided a circuit for generating a reference voltage for use in a semiconductor device, which includes a first reference voltage generating circuit disposed outside a chip, configured to output a first reference voltage to a first output terminal; and a second reference voltage generating circuit configured to output a second reference voltage to a second output terminal. The second reference voltage generating circuit includes at least one pull-up resistor, at least one first pull-down resistor, a second pull-down resistor and a conductive line. The at least one pull-up resistor is coupled between a first node and the second output terminal, wherein the first node is electrically coupled to an external power supply voltage of the chip. The at least one first pull-down resistor is disposed outside the chip and coupled between a first node and the second output terminal. The second pull-down resistor is disposed in the chip and coupled to a ground. The conductive line having a first impedance is electrically coupled between the at least one first pull-down resistor and the second pull-down resistor, wherein a third reference voltage is outputted at a node where the first output terminal is electrically shorted to the second output terminal.

In one exemplary embodiment, the pull-up resistor and the first pull-down resistor have substantially the same resistance and the second pull-down resistor has a resistance substantially equal to the sum of the first impedance and a turn-on resistance of an open drain driver that is used for data transmission between the first and second chips.

In another exemplary embodiment of the present invention, there is provided a method of generating a reference voltage. According to the method, a first reference voltage generated outside a chip to a first output terminal is outputted. A second reference voltage is pulled up to a voltage at the first node, wherein the first node is electrically coupled to a power supply voltage of the chip. The second reference voltage is pulled down to a voltage at a second node, wherein the voltage at the second node is relatively lower than the voltage at the first node. The second reference voltage is outputted to a second output terminal. A third reference voltage of a node where the first output terminal is electrically shorted to the second output terminal is outputted.

In another exemplary embodiment, the pulling down of the second reference voltage includes varying at least one pull-down resistor, and the second pull-down resistor has a resistance substantially equal to the sum of a resistance of a data transmission line and a turn-on resistance of an open drain driver used for data transmission.

In another exemplary embodiment, the pulling up and the pulling down of the second reference voltage include varying a resistance of at least one pull-up resistor and a resistance of at least one pull-down resistor, respectively, and wherein the resistance of the pull-up resistor and the resistance of the pull-down resistor are varied according to a control signal.

BRIEF DESCRIPTION OF THE DRAWINGS

The present invention will become more apparent to those of ordinary skill in the art by describing, in detail, exemplary embodiments thereof with reference to the attached drawings, wherein like elements are represented by like reference numerals, which are given by way of illustration only and thus do not limit the exemplary embodiments of the present invention.

DETAILED DESCRIPTION OF EXEMPLARY EMBODIMENTS

Figure 1:
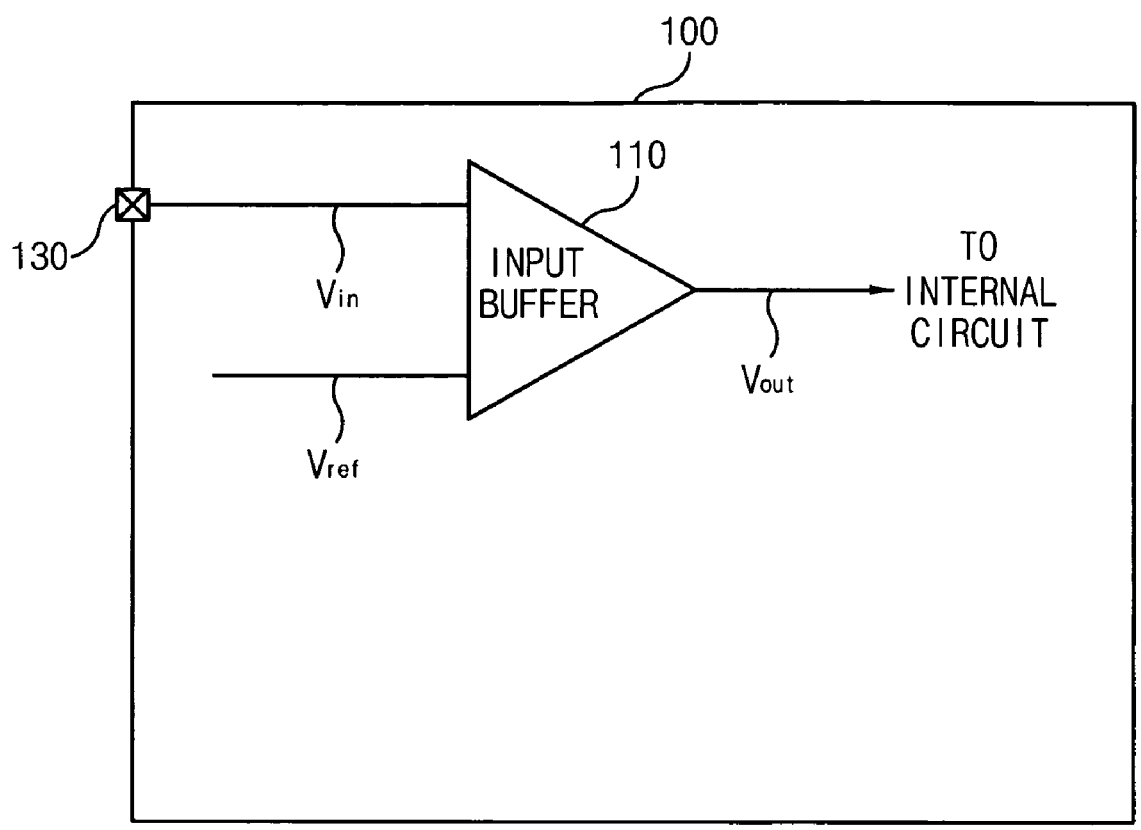
FIG. 1 is a block diagram illustrating a reference voltage for use in a data transmission.
Figure 2A:
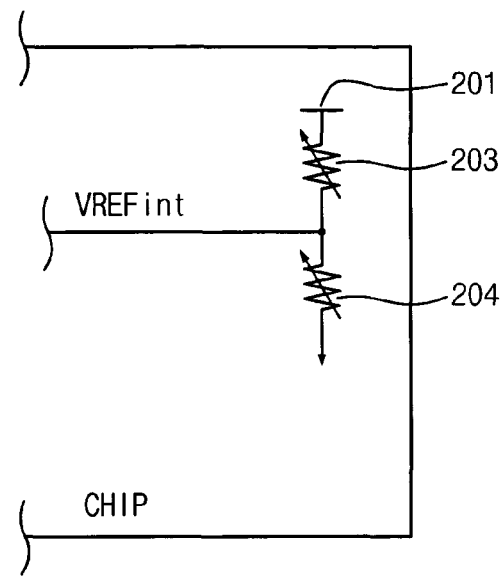
FIGS. 2A and 2B are schematic views illustrating a conventional method of generating a reference voltage.
Figure 2B:
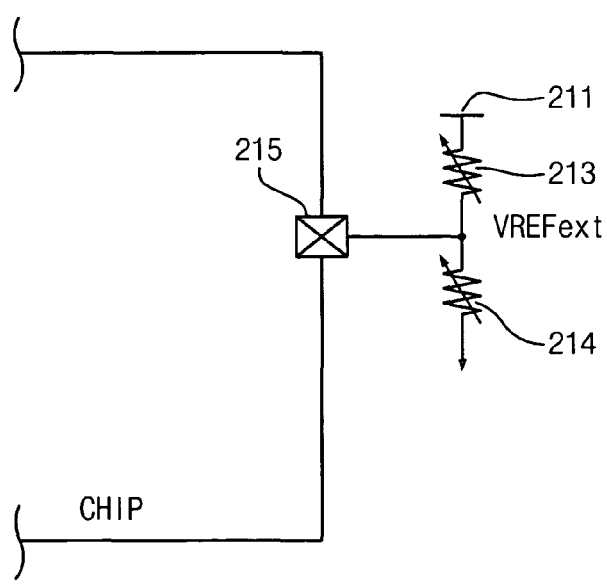

Hereinafter, the present invention will be described in detail with reference to the accompanying drawings.

Exemplary embodiments of the present invention are disclosed herein. However, specific structural and functional details disclosed herein are merely representative for purposes of describing exemplary embodiments of the present invention, however, exemplary embodiments of the present invention may be embodied in many alternate forms and should not be construed as limited to exemplary embodiments of the present invention set forth herein.

Accordingly, while the invention is susceptible to various modifications and alternative forms, specific exemplary embodiments thereof are shown by way of example with reference to the drawings and will herein be described in detail. It should be understood, however, that there is no intent to limit the invention to the particular exemplary embodiments disclosed, but, on the contrary, the intention is to cover all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular exemplary embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
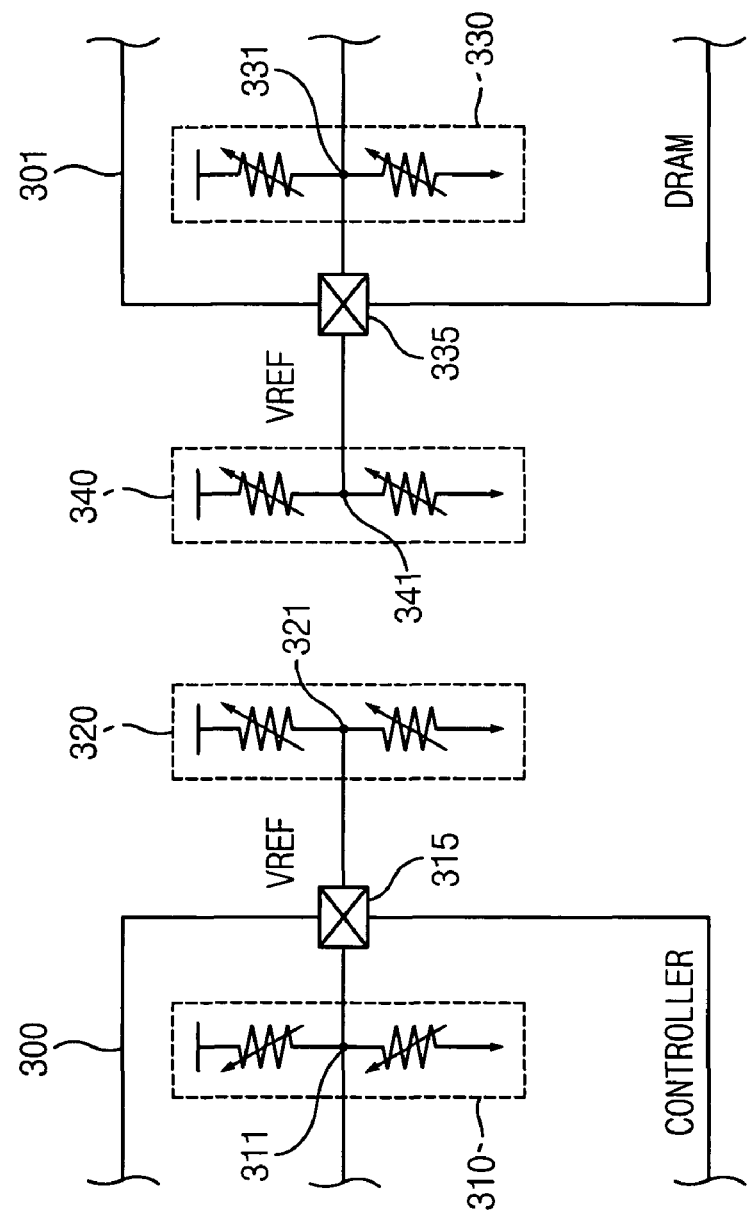
FIG. 3 is a circuit diagram illustrating a circuit for generating a reference voltage according to an exemplary embodiment of the present invention.

FIG. 3 is a circuit diagram illustrating a circuit for generating a reference voltage according to an exemplary embodiment of the present invention. Referring to FIG. 3, the reference voltage VREF is generated for use in a memory controller 300 and a memory device 301. The memory device 301 may be a dynamic RAM (DRAM), static RAM (SRAM), etc.

For the memory controller 300, an output terminal 321 of an external reference voltage generating circuit 320 through which a reference voltage VREF is outputted is electrically shorted to an output terminal 311 of an internal reference voltage generating circuit 310 via a pad 315, thereby providing a stabilized reference voltage VREF.

Similarly, for the memory device 301, an output terminal 341 of an external reference voltage generating circuit 340 through which the reference voltage VREF is outputted is electrically shorted to an output terminal 331 of an internal reference voltage generating circuit 330 via a pad 335, thereby providing a stabilized reference voltage VREF.

The memory controller 300 and the memory device 301 have a similar structure, in that the reference voltage VREF used for the data transmission between the memory device 301 and the memory controller 300 is stabilized. Also, the reference voltage VREF may maintain an optimal voltage level taking into account reduction of noise at the power supply voltage and compensation for the variation in process, internal temperature of the chip, etc.

The generation of the reference voltage VREF of the chip and determination of a level thereof may be implemented using an on-die termination (ODT) that is generally used for impedance matching. A voltage level of the reference voltage VREF may be controlled using a mode register set command in a test operation mode.

In some cases, it may be required to use only one reference voltage between an external reference voltage and an internal reference voltage. For example, the internal reference voltage may not be used in a low-power mode. For such cases, means for disabling one of the internal reference voltage and the external reference voltage are needed.

Figure 4:
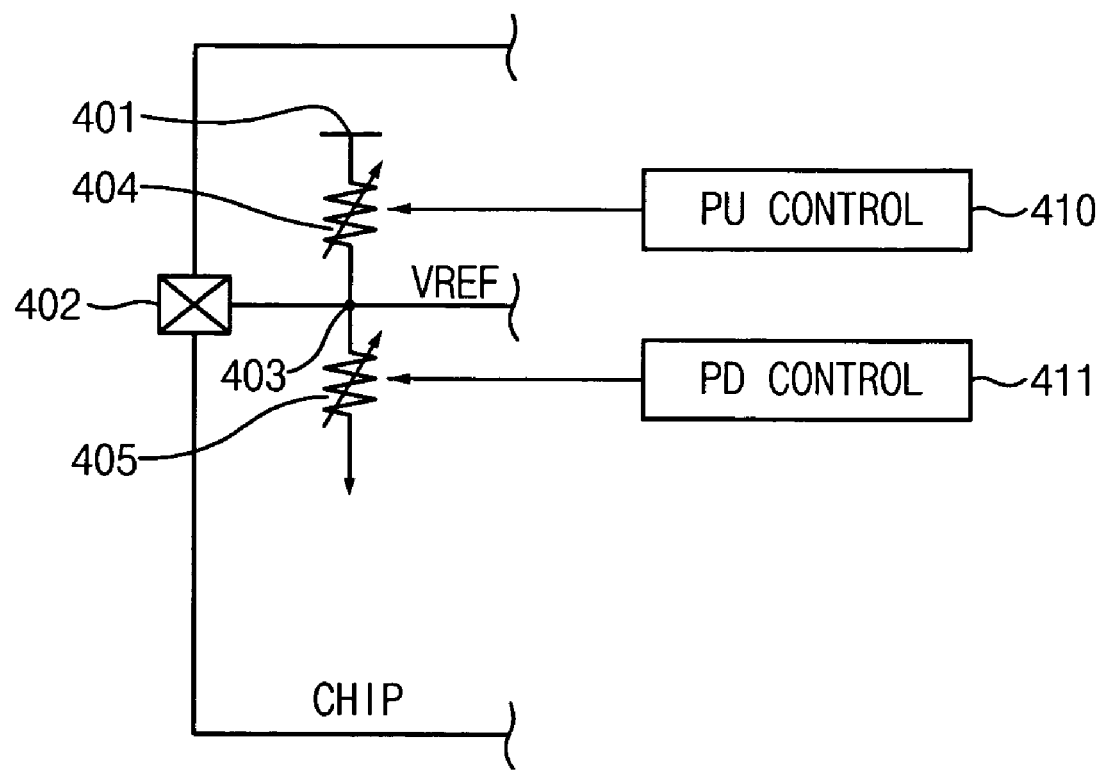
FIG. 4 is a block diagram illustrating a circuit for generating a reference voltage according to an exemplary embodiment of the present invention.

FIG. 4 is a block diagram illustrating a circuit for generating a reference voltage according to an exemplary embodiment of the present invention. Referring to FIG. 4, a reference voltage generating circuit includes a first variable load 404 coupled between a power supply voltage 401 and a node 403, and a second variable load 405 coupled between the node 403 and an internal termination. The reference voltage VREF is outputted from the node 403. The reference voltage generating circuit further includes a pull-up control circuit PU CONTROL 410 for adjusting an impedance of the variable load 404 and a pull-down control circuit PD CONTROL 411 for adjusting an impedance of the variable load 405. For example, each of the variable loads 404 and 405 may include at least one NMOS transistor and at least one PMOS transistor coupled in parallel or in serial to each other to adjust impedance thereof. Therefore, the impedance of the variable loads 404 and 405 may be adjusted by the operation of the pull-up control circuit PU CONTROL 410 and the pull-down control circuit PD CONTROL 411 based on a predetermined mode register set signal, to control a voltage level of the reference voltage outputted from the node 403 of the internal reference voltage generating circuit.

In addition, for some applications where the internal reference voltage is not used and only the external reference voltage is used, the use of the internal reference voltage may be permanently deactivated using, for example, a fuse, bonding, pin option, ball bias option, etc., in a manufacturing process. Accordingly, by using the above options, the pull-up control circuit PU CONTROL 410 and the pull-down control circuit PD CONTROL 411 may control the variable loads 404 and 405 such that the internal reference voltage 403 may not be coupled to either the power supply voltage 401 or the ground.

In a case where only the internal reference voltage is used, a pad 402 for receiving an external reference voltage may float.

When the open-drain driver is used to maintain the reference voltage at a distinct voltage level to determine a logic status of an input signal, the open drain driver in a driver chip may be electrically connected to an internal termination of a receiver chip. When a voltage level of an internal reference voltage of the receiver chip is determined, the reference voltage is electrically shorted to an external reference voltage.

Figure 5:
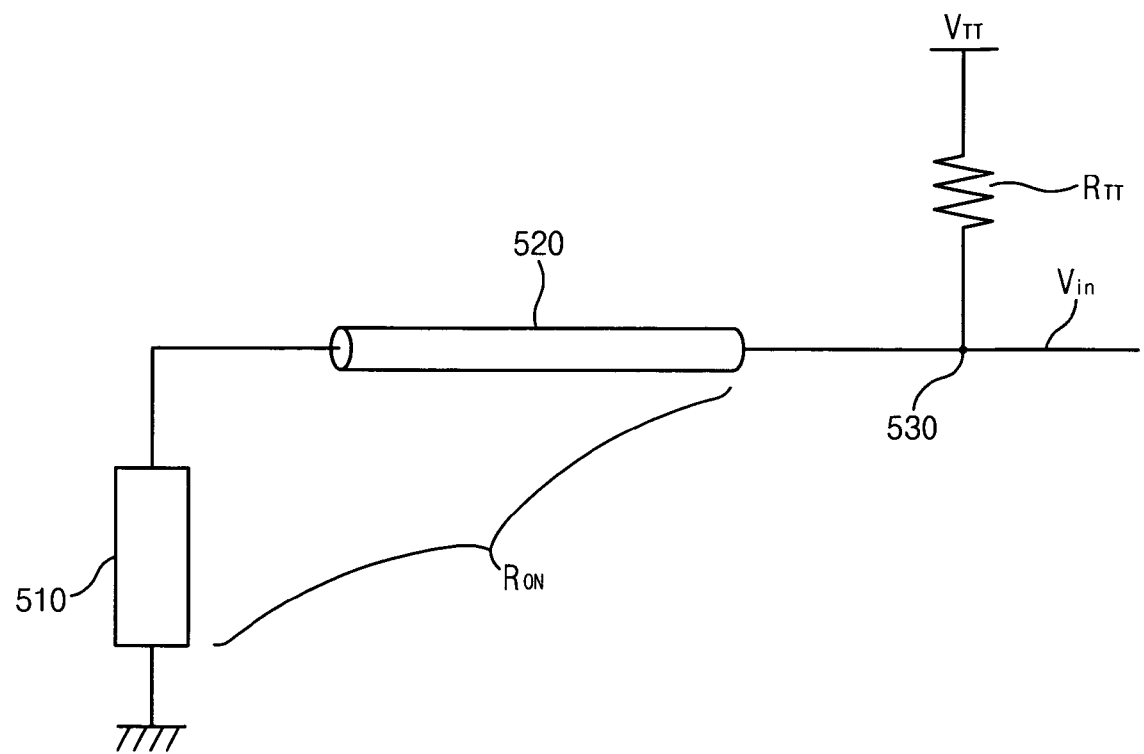
FIG. 5 is a circuit diagram illustrating a data signal transmission using an open drain driver.

FIG. 5 is a circuit diagram illustrating a configuration of a data transmission using an open drain driver.

In FIG. 5, a turn-on resistance of a pull-down driver 510 and a resistance of a transmission line 520 are modeled as RON and a resistance of a resistance coupled between a power supply voltage VTT and an output terminal 530 is modeled as RTT. When the pull-down driver 510 is turned on, the voltage level Vin at the output terminal 530 may be expressed as equation 1, below.

$$V_{in} = V_{OL} = \frac{R_{ON}}{R_{TT} + R_{ON}} \cdot V_{TT} \quad \text{[Equation 1]}$$

When the pull-down driver 510 is turned off, the voltage level Vin at the output terminal 530 can be expressed as equation 2, below.

$$V_{in} = V_{OH} = V_{TT} \quad \text{[Equation 2]}$$

With respect to lower and upper voltages VOL and VOH, it is desirable that the reference voltage Vref may maintain an average of the voltages VOL and VOH as in equation 3, below.

$$V_{ref} = \frac{V_{OH} + V_{OL}}{2} = \frac{R_{ON} + \frac{R_{TT}}{2}}{R_{TT} + R_{ON}} \cdot V_{TT} \quad \text{[Equation 3]}$$

Thus, to stabilize the reference voltage Vref at a certain voltage level, the circuit for generating the reference voltage according to exemplary embodiments of the present invention may be used.

Figure 6:
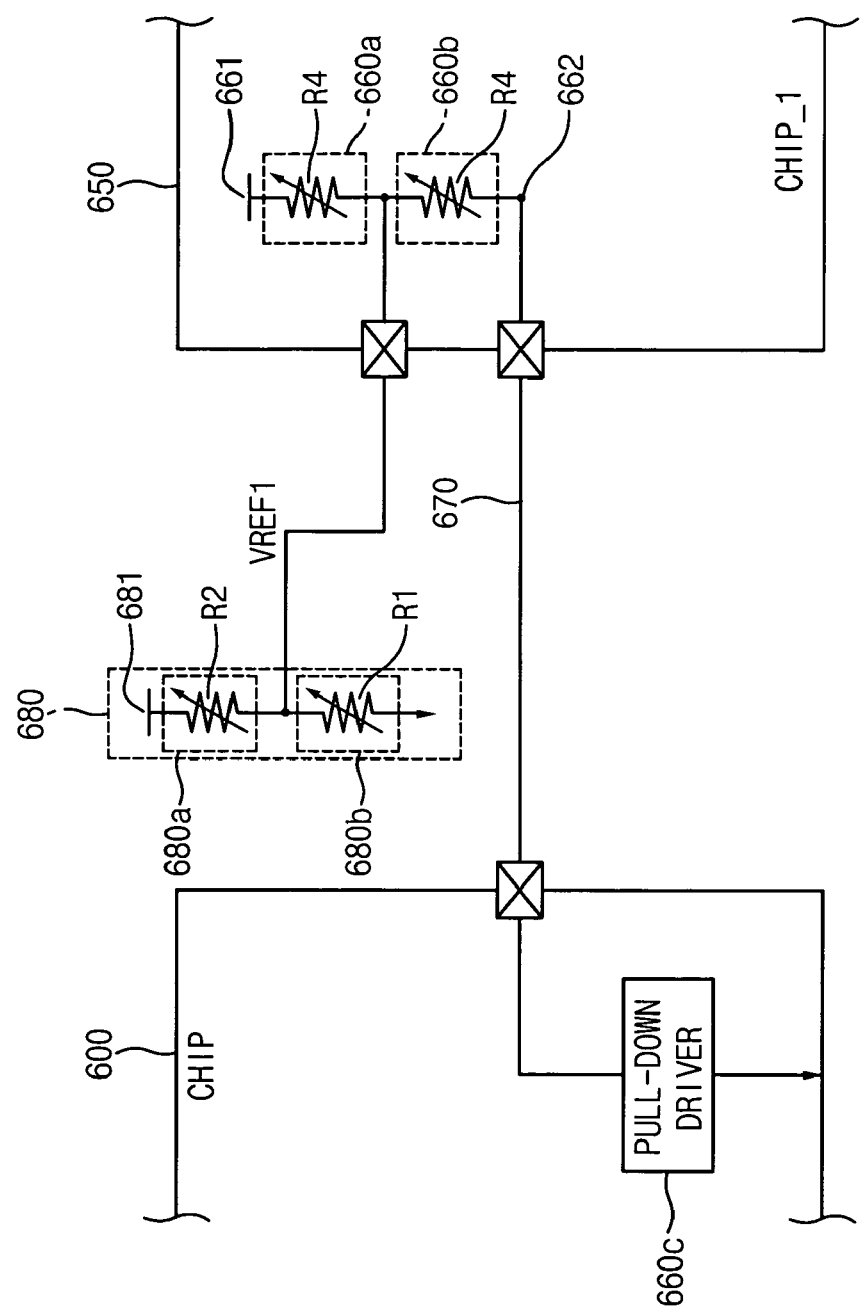
FIG. 6 is a circuit diagram illustrating a circuit for generating a reference voltage for use in a data signal transmission using an open drain driver according to an exemplary embodiment of the present invention.

FIG. 6 is a circuit diagram illustrating a circuit for generating a reference voltage for use in a data signal transmission using an open drain driver according to an exemplary embodiment of the present invention.

The reference voltage generating circuit shown in FIG. 6 uses both an external reference voltage and an internal reference voltage to output the reference voltage having a required voltage level for use in the data signal transmission. Similar to FIG. 4, the reference voltage generating circuit in FIG. 6 includes an external reference voltage generating circuit 680. However, whereas the pull-up control circuit 410 and the pull-down control circuit 411 of the internal reference voltage generating circuit are integrated on the same chip shown in FIG. 4, a pull-down driver 660c is integrated on a transmitter chip CHIP 600 while a pull-up variable resistor 660a and a pull-down variable resistor 660b are integrated on a receiver chip CHIP_1 650 shown in FIG. 6.

The pull-down driver 660c in the transmitter chip CHIP 600 is coupled to the pull-down variable resistor 660b in the receiver chip 650 through a transmission line 670. The pull-down driver 660c in the transmitter chip CHIP 600 may have a size and characteristic substantially the same as that of the open drain driver 510 shown in FIG. 5. The pull-down driver 660c is used to adjust a voltage level of the reference voltage VREF1 as required. Therefore, the pull-down driver 660c may be constantly turned on.

Referring to FIG. 6, when a power supply voltage 681 of the external reference voltage generating circuit 680 has a voltage level substantially the same as a power supply voltage 661 of the internal reference voltage generating circuit, a pull-up variable resistor 680a of the external reference voltage generating circuit 680 may have a resistance R2 substantially the same as a resistance R4 of the pull-up variable resistor 660a of the internal reference voltage generating circuit. In addition, to maintain the reference voltage VREF1 at a voltage level as calculated using equation 3, above, the pull-down variable resistor 660b needs to have a resistance of about one half of the entire resistance of the internal reference voltage generating circuit (i.e., RTT/2 in equation 3). Accordingly, the pull-down variable resistor 660b has a resistance substantially the same as the resistance R4 of the pull-up variable resistor 660a.

In addition, when a turn-on resistance of the pull-down driver 660c and a resistance of a transmission line 670 are modeled as R3, a pull-down variable resistor 680b of the external reference voltage generating circuit 680 may have a resistance R1, substantially equal to the sum of a resistance R4 of the pull-down variable resistor 660b of the internal reference voltage generating circuit and the resistance R3 of the pull-down driver 660c and the transmission line 670.

The relationship between the resistances of each variable load, as described above, is designated such that the external reference voltage outputted from the external reference voltage generating circuit 680 is substantially the same as the internal reference voltage outputted from the internal reference voltage generating circuit (i.e., VREF1). Therefore, it is noted that the resistance R2 of the external reference voltage generating circuit 680 may have a different value from the resistance R4 of the pull-up variable resistor 660a of the internal reference voltage generating circuit if the power supply voltage 681 of the external reference voltage generating circuit 680 is different from the power supply voltage 661 of the internal reference voltage generating circuit.

When the pull-down driver 660c is turned on, the reference voltage VREF1 may be expressed as equation 4, below.

$$V_{REF1} = \frac{R_3 + R_4}{R_2 + 2R_4} \cdot V_{TT} \qquad \text{[Equation 4]}$$

Comparing equation 4 with equation 3, the resistance RTT shown in FIG. 5 is twice the resistance R4, and the resistance R3 is substantially the same as the resistance RON so that the reference voltage Vref of equation 3 and the reference voltage VREF1 of equation 3 are the same. Thus, the reference voltage VREF1 may be stabilized to determine a logic status of an input signal at an input buffer accurately.

Figure 7:
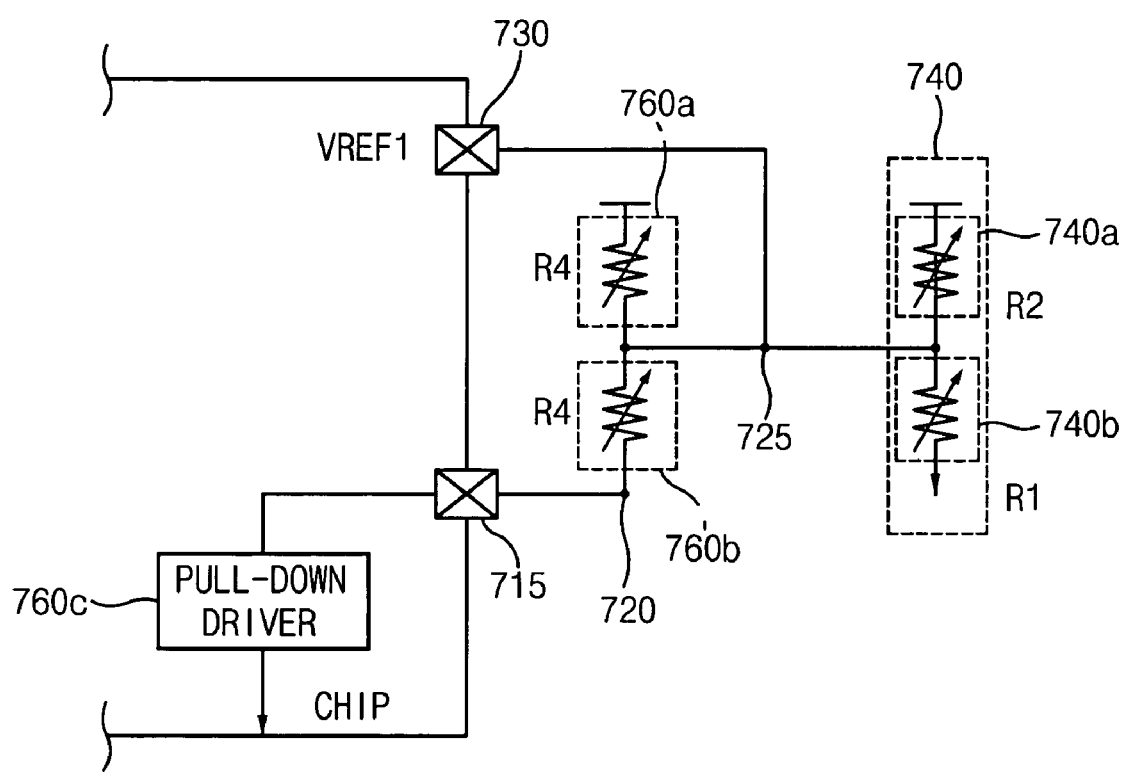
FIG. 7 is a circuit diagram illustrating a circuit for generating a reference voltage for use in a data signal transmission using an open drain driver according to another exemplary embodiment of the present invention.

FIG. 7 is a circuit diagram illustrating a circuit for generating a reference voltage for use in the data signal transmission according to another exemplary embodiment of the present invention. Compared to FIG. 6, the reference voltage generating circuit of the reference voltage circuit shown in FIG. 7 has an external termination 720 outside a chip CHIP, instead of an internal termination of the chip CHIP as in FIG. 6. A pull-down driver 760c is disposed inside the chip CHIP and coupled to the external termination 720 to maintain the reference voltage at a precise voltage level. As shown in FIG. 7, a pull-up section 760a and a pull-down section 760b of a voltage generating circuit are disposed outside the chip while the pull-down driver 760c is disposed inside the chip.

Similar to FIG. 6, a pull-up variable load of an external reference voltage generating circuit 740 may have a resistance R2 substantially the same as a resistance R4 of a pull-up variable load 760a of the reference voltage generating circuit shown in FIG. 7. In addition, when the pull-down driver 760c has a turn-on resistance of R3, a pull-down variable load of the external reference voltage generating circuit 740 may have a resistance R1 substantially equal to the sum of a resistance R4 of a pull-down variable load 760b of the reference voltage generating circuit and the turn-on resistance R3 of the pull-down driver 760c.

Therefore, the reference voltage VREF1 generated at a node 725 may have a voltage level substantially the same as the voltage level VREF1 expressed as equation 4, above. Accordingly, the reference voltage VREF1 may maintain a constant voltage level.

According to the exemplary embodiments of the present invention, by using both an internal voltage generating source and an external voltage generating source, a reference voltage having a stabilized voltage level may be generated so that the noise at the reference voltage resulting from the noise at the power supply voltage may be reduced, while compensating for variations in a process of each chip, internal temperature, etc.

While the processes and apparatus of the present invention have been described in detail for the purpose of illustration, the inventive processes and apparatus are not to be construed as limited thereby. It will be readily apparent to those of reasonable skill in the art that various modifications to the foregoing exemplary embodiments can be made without departing from the spirit and scope of the invention as defined by the appended claims.

What is claimed is:

1. A circuit for generating a reference voltage for use in a semiconductor device, the circuit comprising:
an external reference voltage generating circuit, disposed outside a chip, configured to output a first reference voltage, based on an external power supply voltage, to an output terminal of the external reference voltage generating circuit; and
an internal reference voltage generating circuit, disposed inside the chip, configured to output a second reference voltage, based on an internal power supply voltage of the chip, to an output terminal of the internal reference voltage generating circuit, wherein the internal reference voltage generating circuit includes:
at least one pull-up resistor coupled between a first node and the output terminal of the internal reference voltage generating circuit, wherein the first node is electrically coupled to the internal power supply voltage of the chip; and
at least one pull-down resistor coupled between a second node and the output terminal of the internal reference voltage generating circuit, wherein a voltage at the second node is lower than a voltage at the first node, and wherein the reference voltage corresponding to an average value between a voltage level corresponding to a logic high and a voltage level corresponding to a logic low is present at a node where the output terminal of the external reference voltage generating circuit is coupled to the output terminal of the internal reference voltage generating circuit.

2. The circuit of claim 1, wherein a resistance of the pull-up resistor and a resistance of the pull-down resistor are varied according to a control signal.

3. The circuit of claim 2, wherein the control signal is generated in response to a mode register set command.

4. A circuit for generating a reference voltage for use in a semiconductor device, the circuit comprising:
a first reference voltage generating circuit, disposed outside a first chip, configured to output a first reference voltage, based on an external power supply voltage, to an output terminal of the first reference voltage generating circuit; and
a second reference voltage generating circuit configured to output a second reference voltage, based on an internal power supply voltage of the first chip, to an output terminal of the first chip, wherein the second reference voltage generating circuit includes:
at least one pull-up resistor, disposed inside the first chip, and coupled between a first node and the output terminal of the first chip, wherein the first node is electrically coupled to the internal power supply voltage of the first chip;
at least one pull-down resistor, disposed inside the first chip, and coupled to the output terminal of the first chip;

a pull-down driver disposed inside a second chip and coupled to a ground; and a conductive line having a first impedance configured to be electrically coupled between the at least one pull-down resistor and the pull-down driver, wherein the reference voltage corresponding to an average value between a voltage level corresponding to a logic high and a voltage level corresponding to a logic low is present at a node where the output terminal of the first reference voltage generating circuit is electrically shorted to the output terminal of the first chip.

5. The circuit of claim 4, wherein the pull-up resistor and the pull-down resistor have substantially the same resistance, and wherein the pull-down driver has a resistance substantially equal to a sum of a turn-on resistance of the pull-down driver and the resistance of a transmission line that is used for data transmission between the first chip and the second chip.

6. The circuit of claim 4, wherein the second reference voltage generating circuit is adapted to be deactivated by combining a mode control register.

7. The circuit of claim 4, wherein a resistance of the pull-up resistor and a resistance of the pull-down resistor are varied according to a control signal.

8. The circuit of claim 7, wherein the control signal is generated in response to a mode register set command.

9. A method of generating a reference voltage, comprising:

outputting a first reference voltage that is generated based on an external power supply voltage outside a chip to a first output terminal;

pulling up a second reference voltage to a voltage at a first node, wherein the first node is electrically coupled to an internal power supply voltage of the chip;

pulling down the second reference voltage to a voltage at a second node, wherein the voltage at the second node is relatively lower than the voltage at the first node;

outputting the second reference voltage to a second output terminal; and outputting the reference voltage corresponding to an average value between a voltage level corresponding to a logic high and a voltage level corresponding to a logic low at a node where the first output terminal is electrically shorted to the second output terminal.

10. The method of claim 9, wherein the pulling down of the second reference voltage includes varying at least one pull-down resistor, and wherein a pull-down driver has a resistance substantially equal to the sum of a resistance of a data transmission line used for data transmission and a turn-on resistance of the pull-down driver.

11. The method of claim 9, wherein the pulling up and the pulling down of the second reference voltage include varying a resistance of at least one pull-up resistor and a resistance of at least one pull-down resistor, respectively, and wherein the resistance of the pull-up resistor and the resistance of the pull-down resistor are varied according to a control signal.

12. The circuit of claim 11, wherein the control signal is generated in response to a mode register set command.

* * * * *